United States Patent
Beaumier et al.

(10) Patent No.: US 8,900,927 B2
(45) Date of Patent: Dec. 2, 2014

(54) MULTICHIP ELECTRONIC PACKAGES AND METHODS OF MANUFACTURE

(75) Inventors: Martin M. Beaumier, Quebec (CA); Steven P. Ostrander, Hopewell Junction, NY (US); Kamal K. Sikka, Hopewell Junction, NY (US); Hilton T. Toy, Hopewell Junction, NY (US); Jeffrey A. Zitz, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 170 days.

(21) Appl. No.: 12/856,699

(22) Filed: Aug. 16, 2010

(65) Prior Publication Data
US 2012/0039046 A1  Feb. 16, 2012

(51) Int. Cl.
| H01L 21/00 | (2006.01) |
| H05K 7/20 | (2006.01) |
| F28F 7/00 | (2006.01) |
| H01L 23/42 | (2006.01) |
| H01L 23/10 | (2006.01) |
| H01L 23/433 | (2006.01) |

(52) U.S. Cl.
CPC ........... *H01L 23/4338* (2013.01); *H01L 23/42* (2013.01); *H01L 23/10* (2013.01)
USPC ........... 438/122; 438/125; 361/706; 361/718; 165/80.3; 165/80.4

(58) Field of Classification Search
USPC .......... 438/122, 125; 361/706, 718; 165/80.3, 165/80.4; 257/E21.499
See application file for complete search history.

(56) References Cited

U.S. PATENT DOCUMENTS

| 4,193,445 A | * | 3/1980 | Chu et al. ................. 165/79 |
| 4,685,211 A | * | 8/1987 | Hagihara et al. ............. 29/832 |
| 5,023,695 A | * | 6/1991 | Umezawa et al. ............ 257/714 |
| 5,098,609 A | * | 3/1992 | Iruvanti et al. ................ 252/511 |
| 5,098,846 A |   | 3/1992 | Fleming |
| 5,394,299 A | * | 2/1995 | Chu et al. ..................... 361/705 |
| 5,435,733 A |   | 7/1995 | Chernicky et al. |
| 6,049,456 A |   | 4/2000 | Messina et al. |
| 6,099,786 A |   | 8/2000 | Hu et al. |

(Continued)

OTHER PUBLICATIONS

K. Sikka et al., "Multi-chip package thermal management of IBM z-server systems", Thermomechanical Phenomena in Electronics Systems, 2006. ITHERM '06., pp. 537-544.

(Continued)

*Primary Examiner* — Charles Garber
*Assistant Examiner* — Ron Pompey
(74) *Attorney, Agent, or Firm* — Steven Meyers; Roberts Mlotkowski Safran & Cole, P.C.

(57) ABSTRACT

A multi-chip electronic package and methods of manufacture are provided. The method includes contacting pistons of a lid with respective ones of chips on a chip carrier. The method further includes separating the lid and the chip carrier and placing at least one seal shim on one of the lid and chip carrier. The at least one seal shim has a thickness that results in a gap between the pistons with the respective ones of the chips on the chip carrier. The method further includes dispensing thermal interface material within the gap and in contact with the chips. The method further includes sealing the lid to the chip carrier with the at least one seal shim between the lid and the chip carrier.

22 Claims, 5 Drawing Sheets

(56) References Cited

U.S. PATENT DOCUMENTS

| | | |
|---|---|---|
| 6,125,036 A | 9/2000 | Kang et al. |
| 6,292,369 B1 | 9/2001 | Daves et al. |
| 6,294,408 B1 * | 9/2001 | Edwards et al. ............. 438/121 |
| 6,404,638 B1 | 6/2002 | Messina |
| 6,497,582 B1 | 12/2002 | Hoffmeyer |
| 6,680,220 B2 * | 1/2004 | Minamio et al. ............. 438/110 |
| 6,955,543 B2 | 10/2005 | Messina et al. |
| 7,185,423 B2 | 3/2007 | Augustin et al. |
| 7,405,940 B1 * | 7/2008 | Audet et al. ................. 361/719 |
| 7,443,026 B2 | 10/2008 | Goldmann et al. |
| 7,547,582 B2 | 6/2009 | Brunschwiler et al. |
| 7,629,684 B2 | 12/2009 | Alcoe et al. |
| 2004/0017537 A1 | 1/2004 | Magana et al. |
| 2004/0262371 A1 | 12/2004 | Coico et al. |
| 2005/0068739 A1 * | 3/2005 | Arvelo et al. ................ 361/718 |
| 2009/0098666 A1 * | 4/2009 | Hering et al. ................. 438/15 |
| 2009/0140413 A1 | 6/2009 | Wang et al. |
| 2009/0194882 A1 * | 8/2009 | Mahler et al. ................ 257/773 |
| 2010/0128350 A1 * | 5/2010 | Findlay et al. ............... 359/601 |

OTHER PUBLICATIONS

P.A. Coico et al., "Internal thermal management of IBM P-server large format mulit-chip modules utilizing small gap technology", Adv in Electronic Packaging 2005, pp. 1-6.

Office Action for related U.S. Appl. No. 13/491,174 dated Jul. 24, 2012.

Office Action for related U.S. Appl. No. 13/491,174 dated Mar. 11, 2013.

Final Office Action for related U.S. Appl. No. 13/491,174 dated Oct. 1, 2013, 19 pages.

Office Action for related U.S. Appl. No. 13/491,174 dated Feb. 5, 2014, 14 pages.

* cited by examiner

"Prior Art"

"Prior Art"

as a lid) is posi-
MULTICHIP ELECTRONIC PACKAGES AND METHODS OF MANUFACTURE

FIELD OF THE INVENTION

The invention relates to semiconductor package structures and methods of manufacture and, more particularly, to multi-chip electronic packages and methods of manufacture.

BACKGROUND

Thermal management of multi-chip electronic packages is critical to ideal performance of the multi-chip electronic packages. Currently, multi-chip electronic packages encapsulate chips between a lid and chip carrier by forming a customized gap between pistons of the lid and the chips mounted on the chip carrier, and dispensing a thermal interface material (TIM) within the gap. The gap is formed by the use of a chip shim placed between pistons of the lid and the chips of the multi-chip electronic packages.

Referring to FIGS. 1a and 1b, a plurality of chips 12 are shown attached to a chip carrier 10. During assembly, a chip shim is placed between the pistons 16 and chip 12 in order to form a gap between the pistons 16 and the chips 12 (FIG. 1a). A lid or hat 14 (hereinafter referred to as a lid) is positioned over the chip carrier 10. The lid has "pistons" 16 that are moved such that they contact the chip shim. The lid is then removed from the chip carrier 10, and the pistons 16 are fixedly attached to the lid 14. The chip shim is removed and the thermal interface material is then placed on the chips. Once the thermal interface material is on the chips 12, the chip carrier 10 and lid are sealed to one another in order to encapsulate the chips 12 (FIG. 1b).

The chip shim needs to retain flexibility to conform to the chip surfaces; however, this becomes increasingly more difficult with the increasing number of chips on the package. In fact, it also becomes difficult to use the chip shims when other components or features are placed between the chips. Also, using the chip shim increases production costs due to the complexity of conforming the chip shim to the features of the chip and other components on the chip carrier, as well as the cost of the chip shim, itself.

Accordingly, there exists a need in the art to overcome the deficiencies and limitations described hereinabove.

SUMMARY

In a first aspect of the invention, a method comprises contacting pistons of a lid with respective ones of chips on a chip carrier. The method further comprises separating the lid and the chip carrier and placing at least one seal shim on one of the lid and chip carrier. The at least one seal shim has a thickness that results in a gap between the pistons with the respective ones of the chips on the chip carrier. The method further comprises dispensing thermal interface material within the gap and in contact with the chips. The method further comprises sealing the lid to the chip carrier with the at least one seal shim between the lid and the chip carrier.

In another aspect of the invention, a method comprises placing a lid and chip carrier in proximity to one another such that pistons of the lid are in registration with chips on the chip carrier. The method further comprises contacting the pistons of the lid with respective ones of chips on the chip carrier. The method further comprises moving apart the lid and chip carrier. The method further comprises attaching at least one seal shim to the lid or the chip carrier which, when the lid and chip carrier are attached to one another, form a gap between the pistons with the respective ones of the chips. The method further comprises dispensing thermal interface material within the gap after the attaching of the seal shim. The method further comprises sealing the lid to the chip carrier with the at least one seal shim between the lid and the chip carrier.

In yet another aspect of the invention, a structure comprises a lid encapsulating at least one chip mounted on a chip carrier. The structure further comprises at least one seal shim fixed between the lid and the chip carrier. The at least one seal shim forms a gap between the pistons of the lid and respective ones of the chips. The structure further comprises dispensing thermal interface material within the gap and contacting the pistons of the lid and respective ones of the chips.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The invention relates to semiconductor structures and methods of manufacture and, more particularly, to multi-chip electronic packages and methods of manufacture. More specifically, the present invention addresses the thermal management design of multi-chip electronic packages by using a seal shim to provide a gap for thermal interface material (TIM) provided between a lid and chips (mounted on a chip carrier) of the multi-chip electronic packages; compared to a chip shim that is used to determine a gap between a lid and the chips of the multi-chip electronic packages.

The thickness dimension of the seal shim and sealing material will result in a gap for the TIM. For example, in embodiments, the gap required between the lid and the chips is made by placing the seal shim between the lid and the chip carrier, in addition to sealing material. In embodiments, the seal shim is attached to the lid by a polymer seal, adhesive, epoxy of other substance, or mechanical fasteners (prior to TIM dispense). In further embodiments, the seal shim can be attached to the chip carrier by use of a polymer seal, adhesive, epoxy of other bonding substance. The TIM can be dispensed on the chips at the same time as attaching the seal shim to the lid or the chip carrier, or the seal shim can be attached prior to dispensing of the TIM.

Figure 1A:
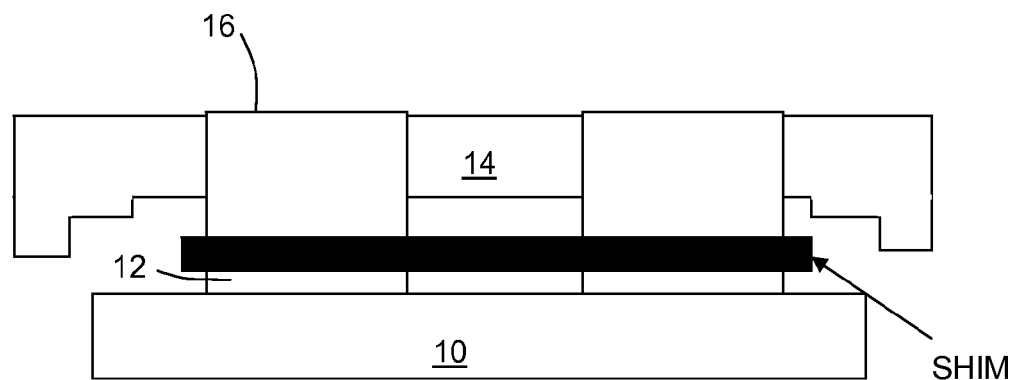
FIGS. 1a and 1b show conventional multi-chip electronic packages and methods of manufacture.
Figure 1B:
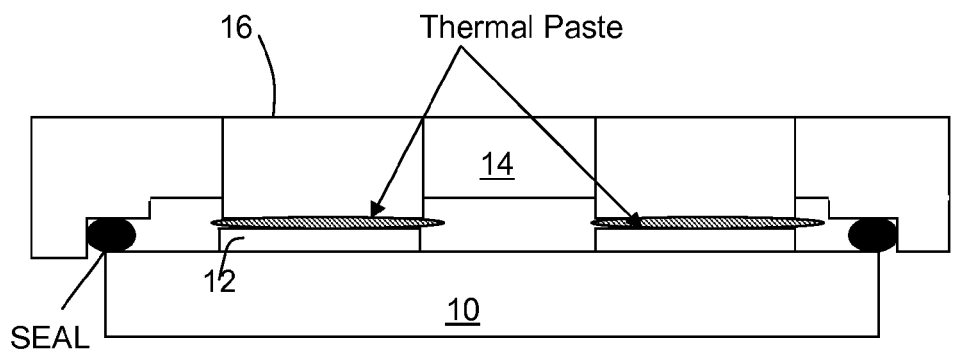
Figure 2:
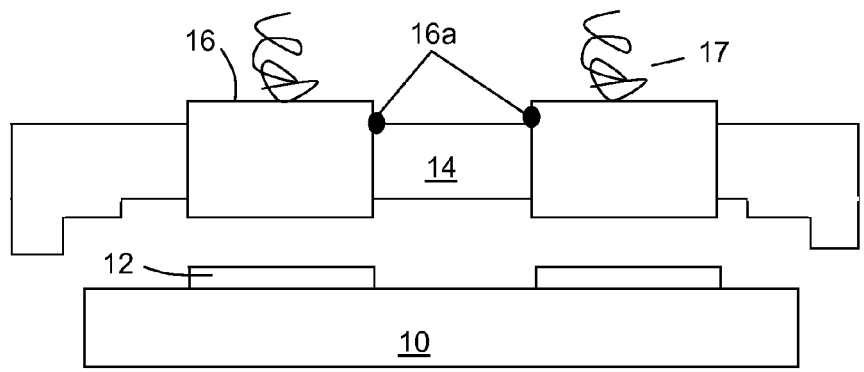
FIGS. 2-4, 5a, 5b, 5c, and 6 show stages of fabricating multi-chip electronic packages in accordance with aspects of the present invention.

FIG. 2 shows a beginning process and related structures in accordance with aspects of the invention. More specifically, FIG. 2 shows a plurality of chips 12 attached to a chip carrier 10. A lid or hat 14 (hereinafter referred to as a lid) is positioned over the chip carrier 10 such that "pistons" 16 are aligned (registered) with each of the chips 12, respectively. The pistons 16 can be releasably attached to the lid 14 by many different methods as shown by reference numeral 16a.

For example, the pistons 16 can be soldered to the lid 14 by solder, or attached by an epoxy of other adhesive. In embodiments, the pistons 16 can be made from copper, for example, and should have a same or substantially same footprint as the chips 12. Advantageously, the method and structure of the present invention is customizable for chips of different sizes (e.g., different thickness), shapes, and power levels. The pistons 16 can be spring loaded into the lid 14 using springs or other resilient mechanisms 17 of a fixture or mechanism attached to lid 14.

Figure 3:
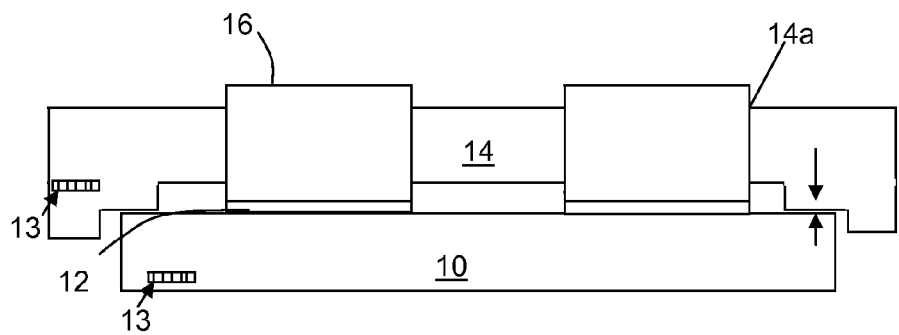

In FIG. 3, in embodiments, the lid 14 and/or the chip carrier 10 can be moved in close proximity to one another. The "pistons" 16 should be aligned (registered) with each of the chips 12, respectively. Once the lid 14 and/or the chip carrier 10 are in close proximity to one another and the pistons 16 and chips 12 aligned, the pistons 16 are released in order to come into direct contact with the chips 12. This will result in a "0" gap between the pistons 16 and the chips 12, which will ensure a precise thermal gap between the pistons 16 and chips 12 when a seal shim in inserted between the chip carrier 10 and lid 14, regardless of the variation in height of the chips. That is, the method of the present invention will ensure that there is a uniform thermal gap between each piston 16 and chip 12 for TIM to be dispensed therebetween, regardless of chip variation, as the entire lid will be raised above the chip carrier 10, with the starting point of the piston 16 be in direct contact with its respective chip 12. This is in contrast to known methods in which a gap between the pistons 16 and chips 12 is determined by a chip shim.

The pistons 16 can be released from the lid 14 using many different methods. For example, when the pistons 16 are soldered to the lid 14 by eutectic solder, the entire assembly can be placed in a reflow furnace to bring the solder to a melting point. When the solder reaches its melting point, the pistons 16 will be released and will move into direct contact with the chips 12. At this stage of processing, for example, the pistons 16 can be forced into direct contact with the chips 12 by the force of the springs or other resilient mechanisms 17 of a fixture or mechanism attached to lid 14.

As the assembly cools, the solder will then harden and again fix the pistons 16 to the lid 14, but now in a lowered position. The position of the pistons 16 are in a final position, with respect to the lid 14.

In the case of an adhesive or epoxy or other bonding agent, a chemical solution can be used to release the pistons 16 from the lid 14. Once the pistons 16 are released, they will move into direct contact with the chips 12. At this stage of processing, for example, the pistons 16 can be forced into direct contact with the chips 12 by the force of the springs or other resilient mechanisms 17 of a fixture or mechanism attached to lid 14.

In this lowered position, the pistons 16 can then be fixed to the lid 14 by, for example, adhesive or epoxy or other bonding agent (including a solder). The position of the pistons 16 are in a final position, with respect to the lid 14.

In alternate embodiments, the pistons 16 can be placed into holes 14a after the lid 14 and/or the chip carrier 10 are moved in close proximity to one another. In this embodiment, the holes 14a are aligned with the chips 12. Once in alignment, the pistons 16 are placed into the holes 14a, and allowed to come into direct physical contact with the chips 12. Once the pistons 16 are in direct contact with the chips 12, they can then be fixed or attached to the lid 14 by solder, adhesive, epoxy or other bonding substance.

Using the embodiments described thus far, the lid 14 and chip carrier 10 are customized for each other. For this reason, the lid 14 and chip carrier 10 combination can be marked by, for example, a bar code or other indicia shown at reference numeral 13 to ensure that the matched lid 14 and chip carrier 10 are attached to one another, in later processing steps, to form a multi-chip electronic package. The bar code or other indicia 13 can provide information about the lid 14 and chip carrier 10, as well as the thermal interface gap that is created between the pistons 16 and chip 12, as discussed in further detail below.

Figure 4:
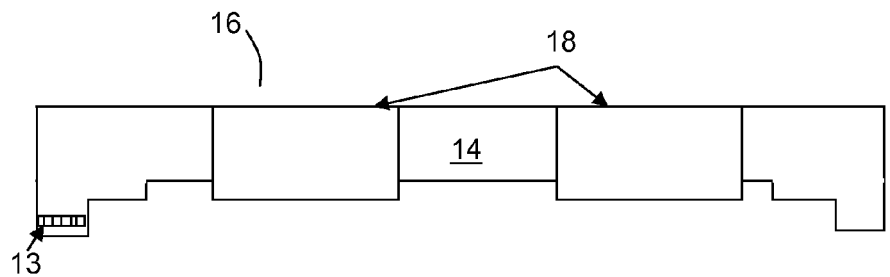

As shown in FIG. 4, the back side of the pistons 16 can be planarized to a flat surface 18 with the surface of the lid 14. In embodiments, the planarization can be performed by a mechanical planarization process such as, for example, a grinding or cutting process, well known to those of skill in the art. The planarization allows good thermal contact between the lid and an external cooling device such as a heat sink or cold plate.

Figure 5A:
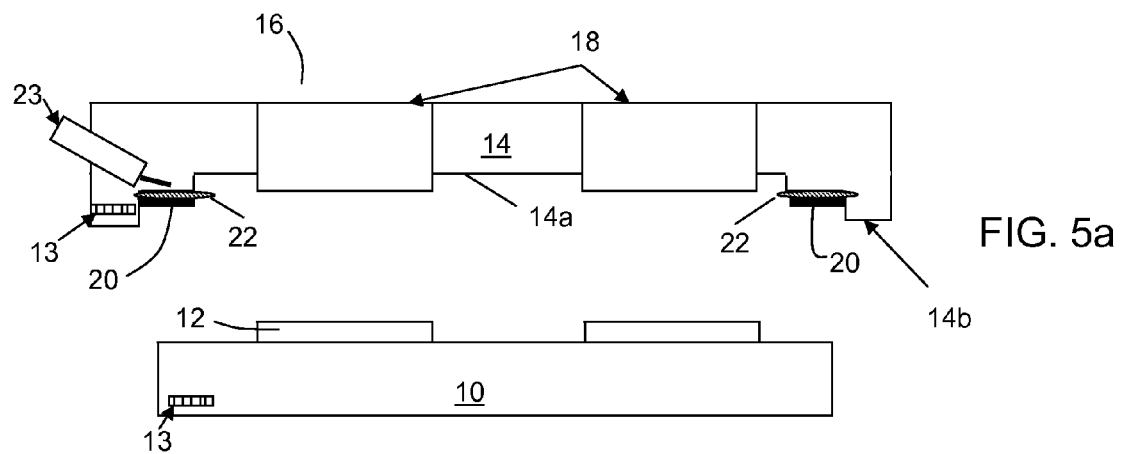
Figure 5B:
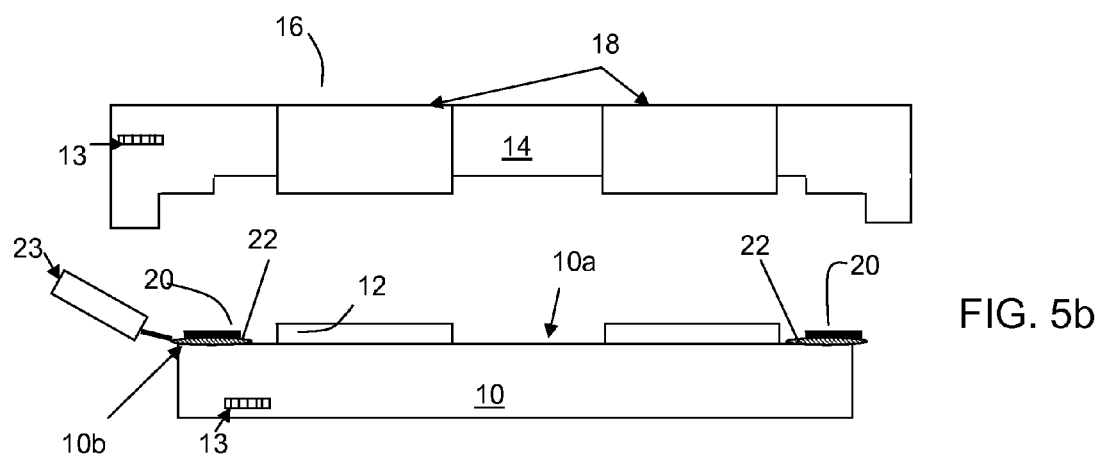
Figure 5C:
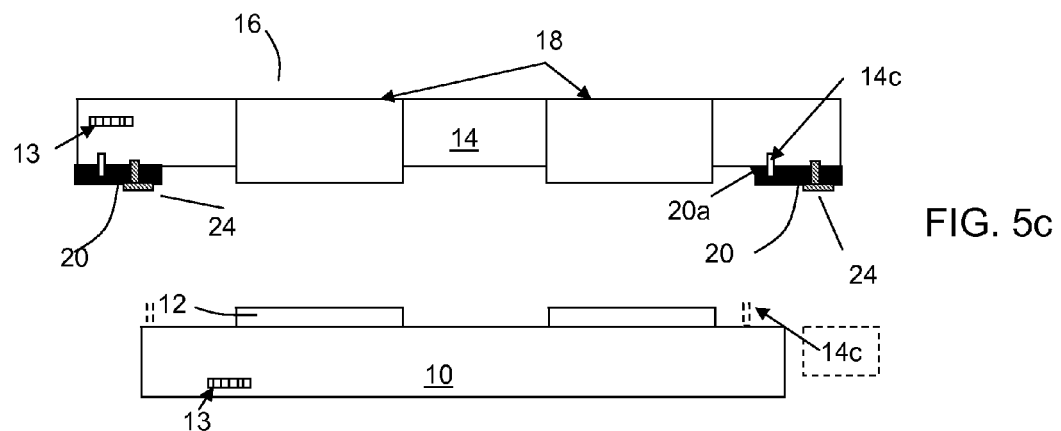

FIGS. 5a, 5b and 5c show different methods of attaching a seal shim 20 to either the lid 14 or chip carrier 10. The seal shim 20 can be made by many different types of materials such as, for example, stainless steel, brass, plastic or other stable material. As should be understood by those of skill in the art, the seal shim 20 (and sealant 22) will create a customizable thermal interface gap between the chips 12 and the pistons 16 for TIM to be dispensed therebetween. In embodiments, the thickness of the seal shim 20 and sealant 22 will be equal or substantially equal to the thermal interface gap (shown in FIG. 6 as reference "G") between the chips 12 and the pistons 16 for the placement of the TIM.

In embodiments, the thermal interface gap "G" is about 25 micrometers to 75 micrometers; although, other dimensions are also contemplated by the present invention. For example, in embodiments, the thermal interface gap "G" can be customized by the thickness of the seal shim 20 and the sealant 22, where the thickness of the seal shim 20 can be between, for example, 25 micrometers to 75 micrometers in thickness. The sealant 22 can be, for example, about 12-25 micrometers thick; although, other dimensions are also contemplated by the present invention. In embodiments, a designer would determine the desired gap dimension and select an appropriate seal shim 20 having a thickness that results in the determined gap dimension, taking into account an sealant 22.

In FIG. 5a, the seal shim 20 is attached to a side 14b of the lid 14, facing the chip carrier 10. In FIG. 5b, the seal shim 20 is attached to a side 10a of the chip carrier 10, facing the lid 14. In both FIGS. 5a and 5b, the seal shim 20 can be attached using a sealant 22 such as, for example, silicon, adhesive or epoxy, for example, know to those of skill in the art. In this way, the seal shim 20 will be a permanent part of the multi-chip electronic package. In both FIGS. 5a and 5b, the seal shim 20 can be self aligned with a protruding portion 14c of the lid 14 or an edge 10b of the chip carrier 10, respectively, or using dowels or machined protrusions, as discussed with reference to FIG. 5c. The sealant 22 can be dispensed with a fluid dispenser needle with a pressure plunger or auger, as shown at reference numeral 23. In embodiments, the seal shim 20 and sealant 22 can be attached prior to or concurrently with TIM.

In FIG. 5c, the seal shim 20 is attached to a side 14b of the lid 14, facing the chip carrier 10, using a mechanical fastener 24. The mechanical fastener 24 may be, for example, a screw. The seal shim 20 can be self aligned with the lid 14 by, for example, the use of dowels or protrusions 14c machined into the lid 14, and extending into one or more holes 20a of the seal shim 20. Alternatively, as shown in FIG. 5c, the seal shim 14 can be self aligned with the chip carrier 10 by, for example, the use of dowels or protrusions 14c machined into the chip carrier 10, and extending into one or more holes 20a of the seal shim 20. In embodiments, similar alignment mechanisms can be used with regard to the aspects of the invention shown in FIGS. 5a and 5b.

Figure 6:
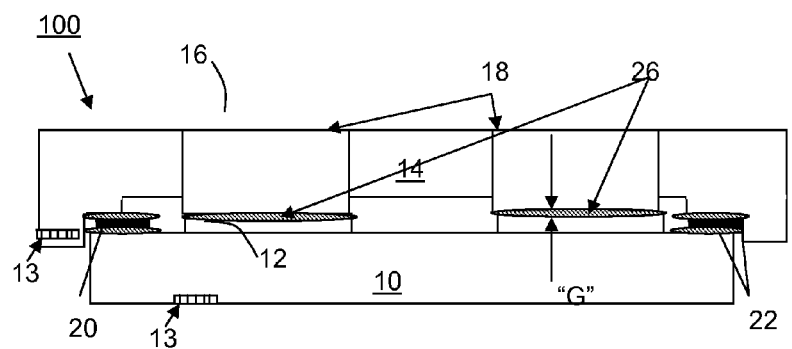

In FIG. 6, the lid 14 and chip carrier 10 are attached to one another with sealant 22. Prior to encapsulating the chips 12 within the multi-chip electronic package 100, a TIM 26 is dispensed on the chips 12. The TIM 26 can be any conventional TIM, and will be placed within the gap "G" formed by the combination of the seal shim 20 and sealant 22 (due to the fact the entire lid (and pistons) are raised from the position of FIG. 3). As discussed above, the method of the present invention will ensure that there is a uniform thermal gap "G" between each piston 16 and chip 12 for TIM to be dispensed therebetween, regardless of chip height and tilt variation, as the entire lid will be raised above the chip carrier 10, with the starting point of the piston 16 being in direct contact with its respective chip 12.

As shown in FIG. 6, the seal shim 20 is a permanent part of the multi-chip electronic package 100. In embodiments, the sealant 22 can be dispensed entirely around the perimeter (or circumference) of the chip carrier 10. In alternate embodiments, the sealant 22 can be dispensed substantially around the perimeter (or circumference) of the chip carrier 10, thereby leaving a space for cleaning the interior of the multi-chip electronic package 100.

Figure 7A:
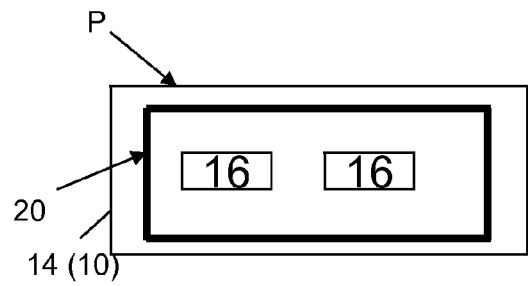
FIGS. 7a-7d show several exemplary arrangements and configurations of seal shims used in the multi-chip electronic packages in accordance with aspects of the present invention.
Figure 7B:
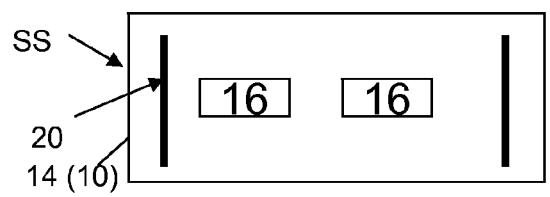
Figure 7C:
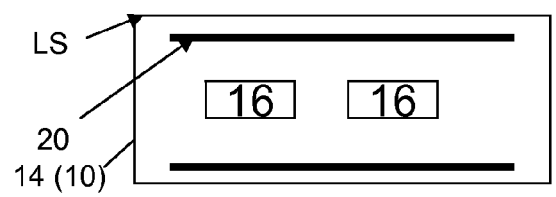
Figure 7D:
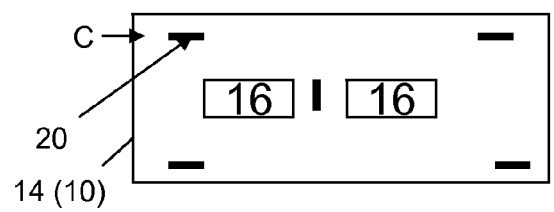

FIGS. 7a-7d show several exemplary arrangements and configurations of the seal shim 20 on the lid 14 or the chip carrier 10. For example, as shown in FIG. 7a, the seal shim 20 can be provided about the entire perimeter (circumference) "P" of the lid 14 or chip carrier 10. As shown in FIG. 7b, the seal shim 20 can be provided about the short sides "SS" of the lid 14 or chip carrier 10. As shown in FIG. 7c, the seal shim 20 can be provided about long sides "LS" of the lid 14 or chip carrier 10. As shown in FIG. 7d, the seal shim 20 can be provided at corners "C" of the lid 14 or chip carrier 10. As should be recognized by those of skill, the arrangements and configurations of FIGS. 7a-7d are merely exemplary, and that other arrangements and configurations are also contemplated by the present invention, as represented by FIGS. 7a-7d. For example, the seal shim 20 can be segmented along any or all sides of the package, or can be placed between the chips 22 (as shown in FIG. 7d). The seal shim 20 can be spheres placed within the seal material 22, or can be other shapes such as those shown in cross section in FIG. 8.

Figure 8:
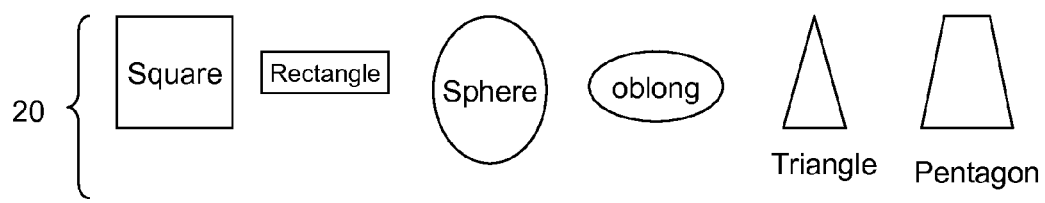
FIG. 8 shows cross sectional views of seal shims used in the multi-chip electronic packages in accordance with aspects of the present invention.

FIG. 8 shows cross sectional views of seal shims 20 used in the multi-chip electronic packages in accordance with aspects of the present invention. For example, the seal shims 20 can be square, rectangular, spherical (oblong), cylindrical (oblong), triangular or pentagon shaped, to name a few.

The method as described above is used in the packaging of integrated circuit chips. The integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims, if applicable, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principals of the invention and the practical application, and to enable others of ordinary skill in the art to understand the invention for various embodiments with various modifications as are suited to the particular use contemplated. Accordingly, while the invention has been described in terms of embodiments, those of skill in the art will recognize that the invention can be practiced with modifications and in the spirit and scope of the appended claims.

What is claimed:

1. A method, comprising:
    contacting pistons of a lid with respective ones of chips on a chip carrier by lowering the lid toward the respective ones of the chips and releasably detaching the pistons from the lid;
    fixing the pistons to the lid after the pistons are in contact with the respective ones of the chips, and thereafter;
    separating the lid and the chip carrier by moving the lid with the pistons attached thereto away from the chip carrier, and thereafter;
    planarizing the pistons with a top surface of the lid by a grinding or a cutting process, and thereafter;
    placing at least one seal shim on one of the lid and chip carrier, the at least one seal shim having a thickness that results in a gap of varying heights between the pistons with the respective ones of the chips on the chip carrier based on the contacting step;
    dispensing thermal interface material within the gap and in contact with the chips; and
    sealing the lid to the chip carrier with the at least one seal shim between the lid and the chip carrier.

2. The method of claim 1, further comprising aligning the pistons of the lid in registration with chips on the chip carrier.

3. The method of claim 1, wherein the fixing the pistons to the lid includes cooling solder such that the solder bonds the pistons to the lid.

4. The method of claim 3, wherein the contacting comprising placing the lid and chip carrier in a reflow furnace and heating the solder to release the pistons from the lid.

5. The method of claim 1, further comprising sealing the at least one seal shim to the one of the lid and chip carrier with a sealant.

6. The method of claim 1, further comprising sealing the at least one seal shim to the lid with a mechanical fastener.

7. The method of claim 1, further comprising aligning the at least one seal shim with the lid with a dowel extending from the lid.

8. The method of claim 1, further comprising aligning the at least one seal shim with the lid with machined protrusions extending from the lid.

9. The method of claim 1, wherein the at least one seal shim is placed at corners of the lid.

10. The method of claim 1, wherein the at least one seal shim is fixed to the one of the lid and the chip carrier prior to dispensing of the thermal interface material.

11. The method of claim 1, wherein the contacting is a direct contact.

12. The method of claim 1, wherein:
the pistons of which are attached directly to the lid are placed in direct physical contact with the respective ones of chips on a chip carrier, prior to the placing of the at least one seal shim;
the pistons are fixed to the lid in a position in which the pistons were in direct physical contact with the respective ones of the chips;
a surface of the piston is planarized to a surface of the lid, which is opposing a surface which was in direct physical contact with the respective ones of the chips;
determining a gap dimension and selecting an appropriate at least one seal shim having a thickness that results in the determined gap dimension; and
the sealing the lid to the chip carrier with the at least one seal shim includes using a sealant.

13. A method, comprising:
placing a lid and chip carrier in proximity to one another such that pistons which are attached to the lid are in registration with chips on the chip carrier;
releasing the pistons from the lid so that the pistons move into contact with respective ones of chips on the chip carrier;
fixing the pistons to the lid after the pistons are in contact with the respective chips of the chip carrier;
moving apart the lid and chip carrier such that the pistons are no longer in contact with the chips on the chip carrier, and thereafter;
planarizing the pistons with a surface of the lid by a grinding or a cutting process, and thereafter;
attaching at least one seal shim to the lid or the chip carrier which, when the lid and chip carrier are attached to one another, form a gap of varying heights between the pistons with the respective ones of the chips based on the placing step;
dispensing thermal interface material within the gap after the attaching of the seal shim; and
sealing the lid to the chip carrier with the at least one seal shim between the lid and the chip carrier by moving the lid towards the chip carrier.

14. The method of claim 13, wherein the fixing the pistons to the lid includes one of:
cooling solder to the pistons and to the lid; and
applying an adhesive to the pistons and the lid.

15. The method of claim 13, wherein the contacting the pistons with the respective chips comprising placing the lid and chip carrier in a reflow furnace and heating solder to release the pistons from the lid.

16. The method of claim 13, further comprising sealing the at least one seal shim to the lid and chip carrier with a sealant.

17. The method of claim 13, further comprising attaching the at least one seal shim to the lid with a mechanical fastener.

18. The method of claim 1, further comprising:
providing a bar code or other indicia on a combination of the lid and the chip carrier to identify that the lid remains matched to the chip carrier, wherein:
the pistons are fixed to the lid in a lowered position, at different heights;
the pistons are fixed to the lid; and
the at least one seal shim is attached directly to the lid and the chip carrier during the sealing.

19. A method, comprising:
fixing a piston to a lid by solder or adhesive, and thereafter;
lowering the piston and the lid towards a chip on a chip carrier, and thereafter;
aligning the piston with the chip, and thereafter;
releasing the piston from the lid such that the piston is lowered and makes contact with the chip, and thereafter;
grinding or cutting a backside of the piston to be planar with the lid, and thereafter;
fixing the piston to the lid, in the lowered position, and thereafter;
moving the piston and the lid away from the chip, and thereafter;
placing at least one seal shim on one of the lid and chip carrier, the at least one seal shim having a thickness that results in a gap of varying heights between the piston with the chip on the chip carrier, based on the aligning step, and thereafter;
dispensing thermal interface material within the gap and in contact with the chip, and thereafter; and
sealing the lid to the chip carrier with the at least one seal shim directly between the lid and the chip carrier.

20. The method of claim 19, further comprising providing a bar code or other indicia on a combination of the lid and the chip carrier to identify that the lid remains matched to the chip carrier.

21. The method of claim 1, wherein the dispensing of the thermal interface material results in uniform thermal gaps between each of the pistons and the chips, regardless of chip height and tilt variation.

22. The method of claim 21, wherein the placing of the at least one seal shim includes placing the at least one seal shim about short sides of the lid or long sides of the lid.

* * * * *